(12) United States Patent
Nuyen

(10) Patent No.: US 6,787,822 B1
(45) Date of Patent: Sep. 7, 2004

(54) HETEROJUNCTION III-V TRANSISTOR, IN PARTICULAR HEMT FIELD EFFECT TRANSISTOR OR HETEROJUNCTION BIPOLAR TRANSISTOR

(75) Inventor: Linh T. Nuyen, Paris (FR)

(73) Assignee: Picogiga International, Bernin (FR)

( * ) Notice: Subject to any disclaimer, the term of this patent is extended or adjusted under 35 U.S.C. 154(b) by 0 days.

(21) Appl. No.: 09/979,098

(22) PCT Filed: Jun. 28, 2000

(86) PCT No.: PCT/FR00/01806

§ 371 (c)(1),
(2), (4) Date: Nov. 19, 2001

(87) PCT Pub. No.: WO01/03194

PCT Pub. Date: Jan. 11, 2001

(30) Foreign Application Priority Data

Jul. 1, 1999 (FR) .......................................... 99 08487

(51) Int. Cl.$^7$ ........................ H01L 29/12; H01L 29/732; H01L 31/0328; H01L 31/0336; H01L 31/072; H01L 31/109; H01L 31/0256
(52) U.S. Cl. ........................ 257/198; 257/201; 257/197; 257/613; 257/183; 257/615; 257/191; 257/194; 257/195
(58) Field of Search ................................ 257/194, 195, 257/197, 198, 201, 190, 191, 183, 615, 613

(56) References Cited

U.S. PATENT DOCUMENTS

| 5,383,211 A | 1/1995 | Van de Walle et al. |
| 5,689,123 A | 11/1997 | Major et al. |
| 5,710,439 A | 1/1998 | Ohkubo |
| 5,903,586 A | 5/1999 | Ramdani et al. |

(List continued on next page.)

FOREIGN PATENT DOCUMENTS

| EP | 0 833 395 a | 4/1998 |
| WO | WO 99 14809 A | 5/1999 |

OTHER PUBLICATIONS

Soukiassian P et al.; "Room–Temperature Nitridation of Gallium Arsenide Using Alkali Metal and Molecular Nitrogen"; Physical Review, B. Condensed Matter, American Inst. of Physics. NY, US; vol. 42, No. 6, Aug. 15, 1990; pp. 3769–3772; XP000151568.

(List continued on next page.)

Primary Examiner—Nathan J. Flynn
Assistant Examiner—Victor A. Mandala, Jr.
(74) Attorney, Agent, or Firm—Nixon & Vanderhye P.C.

(57) ABSTRACT

The heterojunction transistor comprises III–V semiconductor materials with a broad forbidden band material and a narrow forbidden band material. The narrow forbidden band material is an III–V compound containing gallium as one of its III elements and both arsenic and nitrogen as V elements, the nitrogen content being less than about 5%, and the narrow forbidden band material includes at least a fourth III or V element. Adding this fourth element makes it possible to adjust the width of the forbidden band, the conduction band discontinuity $\Delta Ec$, and the valance band discontinuity $\Delta Ev$ of the heterojunction. The invention is applicable to making field effect transistors of the HEMT type having a very small forbidden band, and thus having high drain current. It also applies to making heterojunction bipolar transistors of small $V_{BE}$, and thus capable of operating with power supply voltages that are very low.

16 Claims, 3 Drawing Sheets

U.S. PATENT DOCUMENTS 6,100,546 A * 8/2000 Major et al. ................. 257/103
6,436,784 B1 * 8/2002 Allam ......................... 438/380

OTHER PUBLICATIONS

Kondow M. et al; "Gainnas: A Novel Material For Long–Wavelength–Range Laser Diodes With Excellent High–Temperature Performance" Japanese Journal of Applied Physics. JP, Publication Office Japanese Journal of Applied Physics, Tokyo; vol. 35, No. 2B; Feb. 1, 1996pp. 1273–1275; XP000701044.

Han J et al; "Growth And Febrication of Gan/Aigan Heterojunction Bipolar Transistor"; Applied Physics Letters, US, American Institute of Physics. NY; vol. 74, No. 18; Mar. 3, 1999; pp. 27002–2704; XP000823896.

Patent Abstract of JP, vol. 1998, No. 14; Dec. 31, 1998; & JP 10 233557 A; Sep. 2, 1998.

Database WPI; Derwent Publications Ltd., London, GB; An 2000–309926; XP002143756; & JP 2000 091559; Mar. 31, 2000.

* cited by examiner

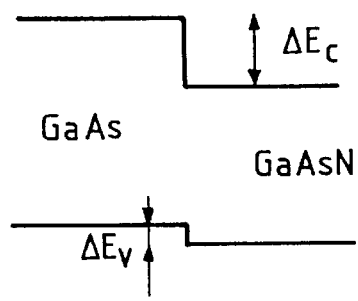
FIG_1
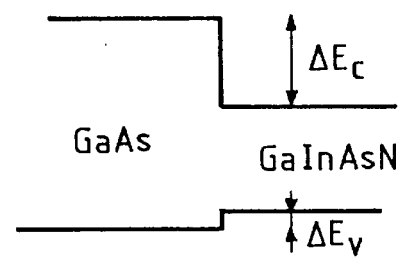
FIG_2
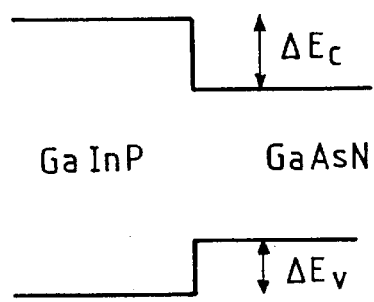
FIG_3
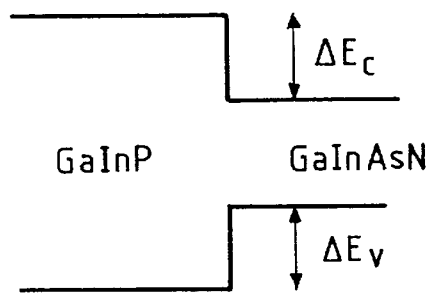
FIG_4

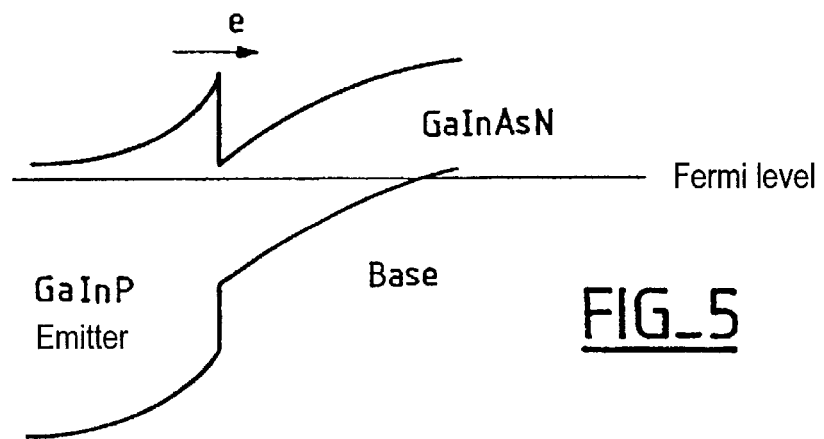
FIG_5
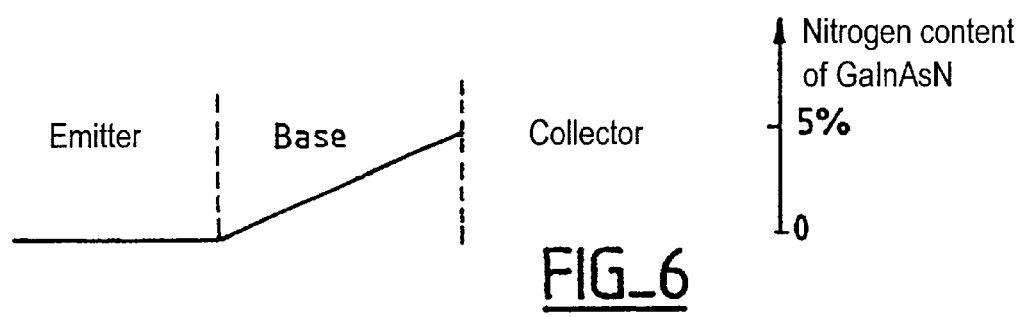
FIG_6
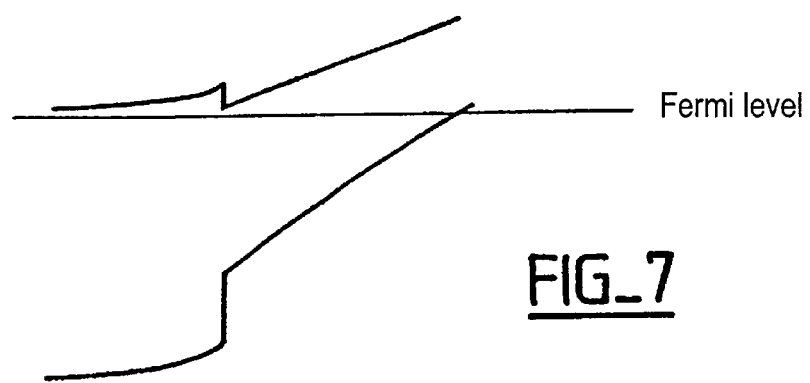
FIG_7

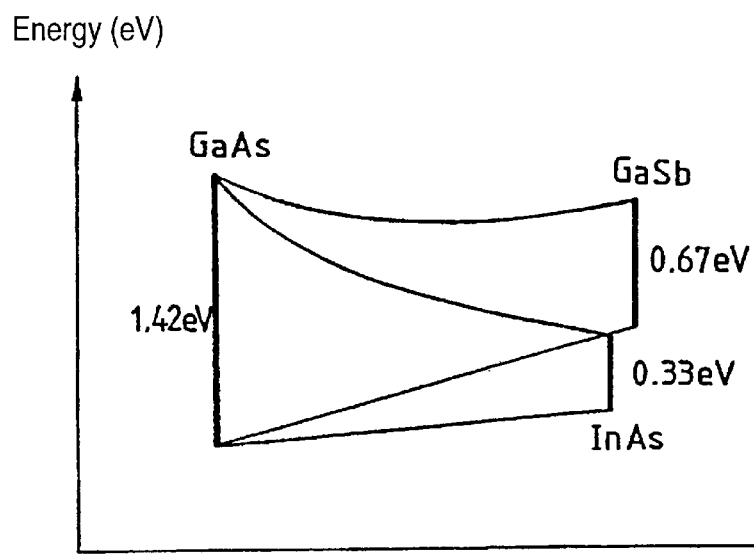
FIG_8
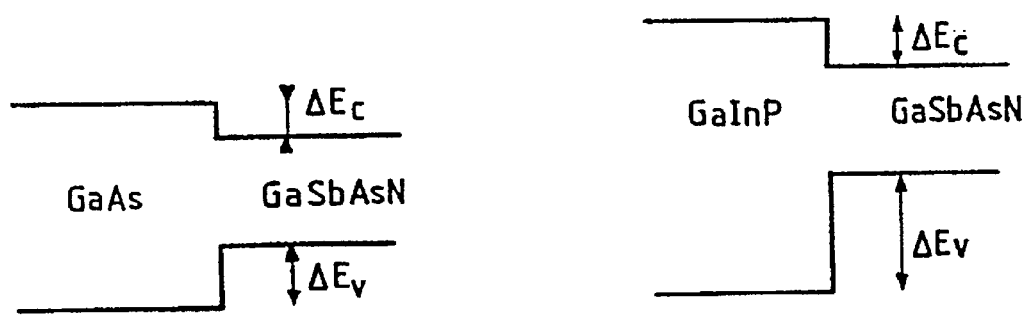
FIG_9
FIG_10

HETEROJUNCTION III-V TRANSISTOR, IN PARTICULAR HEMT FIELD EFFECT TRANSISTOR OR HETEROJUNCTION BIPOLAR TRANSISTOR

This application is the U.S. national phase of international application PCT/FR00/01806, filed on Jun. 28, 2000, which designated the U.S. PCT/FR00/01806 claims priority to FR99/08487 filed Jul. 1, 1999. The entire contents of these applications are incorporated herein by reference.

The invention relates to a heterojunction transistors of the field effect transistor category or of the bipolar transistor category, using III–V semiconductor alloys.

III–V semiconductors, of which the best known is gallium arsenide GaAs, constitute a vast family making use of one or more elements from column III and one or more elements from column V of the periodic table. Thus there exist:

binary compounds such as GaAs or InP;

ternary compounds such as AlGaAs or GaInAs or GaInP; and quaternary compounds such as GaInAsP or AlGaSbAs.

In ternary or quaternary alloys, the III elements substitute for one another and likewise the V elements substitute for one another so that the III elements as a whole and the V elements as a whole are of equal composition: for example $Al_xGa_{1-x}As$ or $Ga_xIn_{1-x}As_yP_{1-y}$. To avoid overburdening the text, the simpler notation AlGaAs or GaInAsP is adopted below. Wherever necessary, the concentrations of the various elements are specified. Furthermore, the various elements making up an alloy are given in the standardized order (from the most electropositive to the least electropositive), and not in order of decreasing concentration.

The advantage of such ternary or quaternary alloys or indeed quinary alloys when making electronic components stems from the fact that substituting one III element for another or one V element for another modifies the electronic properties of the alloy, e.g. the effective mass of electrons or holes, or indeed the width of the forbidden band. These modifications are taken advantage of when making heterojunctions, i.e. junctions between two materials of different kinds, e.g. AlGaAs/GaAs or GaInAsP/GaAs, etc.

Semiconductor lasers made of AlGaAs/GaAs or GaInAsP/AlGaInP or InGaAs/GaAs/GaInP are well known examples of using heterojunctions to make lasers that emit at the following wavelengths respectively 870 nanometers (nm), 670 nm, and 980 nm.

So-called high electron mobility field effect transistors (HEMTs) making use of AlGaAs/GaAs or AlGaAs/GaInAs/GaAs heterojunctions are also well known for their performance which is better than that of conventional non-heterojunction GaAs transistors.

Heterojunction bipolar transistors (HBTs) of the AlGaAs/GaAs or GaInAsP/GaAs type are also known for their performance which is better than that of non-heterojunction GaAs bipolar transistors.

In spite of the flexibility with which III–V semiconductor alloys can be combined with one another in the form of a heterojunction, there nevertheless exists a limit on such combination.

Different materials can be associated with each other only if they have the same crystal lattice parameter or have lattice parameters that are very similar, so as to ensure that high mechanical stresses do not appear between the various materials. High stress can lead to dislocations appearing at the interface between the two materials, which dislocations then propagate throughout one of the two materials, thereby degrading the quality of such materials and consequently the quality of the electronic component. When the mismatch between the lattice parameters of the two parameters is small, it is possible to grow a heterojunction by epitaxy without causing dislocations to appear at the interface since the mechanical stress generated is small enough for the material to remain within its bounds for elastic deformation. It is known that elastic deformation is a function both of the difference between the crystal lattice parameters and of the thickness of the stressed layer. Below a certain thickness known as the "critical" thickness, the layer remains in a state of elastic deformation, i.e. free from dislocations, and above the critical thickness the stresses are relaxed by the appearance of dislocations.

Many electronic components make use of this possibility to achieve elastic stress in order to provide heterojunctions having electronic characteristics of interest. For example, AlGaAs/GaInAs heterojunctions are made in which the indium content can be as much as 25%, thereby creating a parameter mismatch approaching 2% and thus imposing a critical thickness of about 10 nm.

This stressed GaInAs material presents advantages over non-stressed GaAs material when making HEMTs: electron mobility is improved; the conduction band discontinuity at the heterojunction interface is advantageously greater. Such HEMTs using the narrow forbidden band material in the elastic stress state are referred as "pseudomorphic" HEMTs. Pseudomorphic HEMTs are in very widespread use for low noise amplification and for power amplification.

HBTs make little use of this pseudomorphic state because the base of an HBT is generally about 100 nm thick, and thus thicker than the critical thickness for lattice mismatch materials that are liable to present electronic characteristics of interest. Thus, no pseudomorphic HBTs are known as industrial products.

Furthermore, because heterojunctions are generally grown epitaxially on a substrate, it is the substrate which determines the lattice parameter. For practical reasons, substrates are binary compounds, and the compound in most widespread use industrially is GaAs. This is followed by InP which is difficult to manufacture and therefore expensive and which is also fragile and brittle. In spite of this handicap, Inp is often used because it makes it possible to implement alloys such as GaInAs or GaInAsP with very high indium contents, up to as much as 60%. Such alloys present electronic properties of interest, such as a narrow forbidden band extending from 0.6 electron volts (eV) to 1 eV.

Thus, in the present state of the art, the HEMTs in most widespread use can be put into two categories. The first category uses a GaAs substrate and arsenides as the narrow forbidden band material: GaAs for non-pseudomorphic HEMTs and GaInAs for pseudomorphic HEMTs having an indium content up to about 25%. The second category uses an InP substrate and arsenides as the narrow forbidden band material: GaInAs with indium at 52% for non-pseudomorphic HEMTs and at up to about 65% for pseudomorphic HEMTs.

In the same manner and in the present state of the art, HBTs can be put into two categories: those made on a GaAs substrate with GaAs as the narrow forbidden band material, and those on an InP substrate with GaInAs (52% indium content) as the narrow forbidden band material. As recalled above, pseudomorphic HBTs have not been developed industrially.

Nevertheless, both in HEMTs and in HBTs, the use of arsenides as the narrow forbidden band material presents limitations.

In HEMTs, the limitations occur as follows: the main characteristic of HEMTs is the association of a material having a broad forbidden band, generally AlGaAs with a material having a narrow forbidden band, GaAs or GaInAs, thus making it possible to obtain a two-dimensional electron gas that accumulates in the narrow forbidden band material when the broad forbidden band material is doped. This transfer of electrons from the broad forbidden band material to the narrow forbidden band material is more effective with increasing conduction band discontinuity $\Delta Ec$. Having a two-dimensional electron gas of high density makes it possible for the drain current of the transistor to be greater, and thus for power amplification to be more efficient. Unfortunately, in the arsenide system with an AlGaAs/GaAs or an AlGaAs/GaInAs combination, the $\Delta Ec$ discontinuity is limited. Firstly $\Delta Ec$, which increases with the aluminum content in AlGaAs, cannot exceed a certain value, since above 22% aluminum, troublesome defects known as "DX centers" appear in the AlGaAs, and above 40% the AlGaAs material presents an indirect forbidden band. Secondly, adding indium to GaAs also makes it possible to increase $\Delta Ec$, but as recalled above, in practice it is hardly possible to exceed 25%. As a result, in practice, the AlGaAs/GaInAs system has a $\Delta Ec$ maximum of about 400 millielectron volts (meV). In the category of HEMTs on an InP substrate where the broad forbidden band material is AlInAs (53% indium) and the narrow forbidden band material is GaInAs (up to 65% indium), $\Delta Ec$ does not exceed 600 meV.

In HBTs, the limitations occur as follows: one of the important characteristics of an HBT is the base-mitter voltage $V_{BE}$ that must be applied to its base relative to the emitter in order to ensure that the collector receives current. This ON voltage $V_{BE}$ depends strongly on the width of the forbidden band of the material from which the base is made. For example, if the base material is GaAs, then the ON voltage $V_{BE}$ is about 1 volt. However, one of the major applications of HBTs, in volume terms, is power amplification in mobile telephones. In this application, the power supply voltage is delivered by a battery and for reasons, amongst other things, of battery weight and compatibility between the power supply voltage and other electronic functions contained in a mobile telephone, power supply voltage has been dropping as semiconductor technology advances. In 1999, the lowest voltage in use in pocket-sized telephones is about 3 volts, such that an HBT with a GaAs base and a $V_{BE}$ voltage of 1 volt is entirely viable since there still remain two usable volts. However when the voltage drops towards 1.5 volts or less, a $V_{BE}$ voltage of 1 volt. is no longer acceptable. It is therefore necessary to reduce the $V_{BE}$ voltage, in other words to have an HBT made of a material whose forbidden bandwidth is as narrow as possible. One solution would be to use the second category of HBTs grown epitaxially on InP, since the base made of GaInAs (52% indium content) has a forbidden band of about 0.75 eV which could lead to an ON voltage $V_{BE}$ of about 0.3 volts. However, as mentioned above, an InP substrate is expensive and fragile. The cost of the component would be too high for an industrial application in which cost reduction is a major factor.

To mitigate those drawbacks, the present invention essentially proposes using heterojunction transistors in which the narrow forbidden band material is constituted by an alloy making use simultaneously of at least two V elements, arsenic and nitrogen.

III–V components which contain both arsenic and nitrogen have the feature of presenting a forbidden bandwidth that is narrower than those which do not contain them. In other words, substituting a small fraction of arsenic with the same fraction of nitrogen greatly reduces the size of the forbidden band. For example, the compound GaAsN with 4% nitrogen has a forbidden bandwidth of about 1 eV, whereas the forbidden bandwidth of GaAs is 1.42 eV. This property is unexpected since given that GaN is a material having a very broad forbidden band (3.4 eV), a rule of thumb that often applies to III–V compounds would lead to assuming that the GaAsN compound had a forbidden band of greater width than that of GaAs. This exceptional property was mentioned for the first time by M. Weyers et al. in Jpn. J. Appl. Phys., Vol. 31 (1992), 853, and theoretical calculations confirm those experimental results (S. Sakai et al., Jpn. J. Appl. Phys., Vol. 32 (1993), 4413).

The lattice parameter of GaAsN compounds obeys Vegard's law, i.e. it varies linearly with nitrogen content. Thus, when a thin layer of GaAsN is grown epitaxially on a GaAs substrate, the thin layer is in a stressed state, given that the crystal lattice parameter for GaN (0.45 nm) is smaller than that of GaAs (0.565 nm). Work by Y. Qui et al. (Appl. Phys. Lett., 70 (24), 3242 (1997)) and by E.V.K. Rao et al. (Appl. Phys. Lett., 72 (12), 1409 (1998)) shows that the critical thickness for layers of GaAsN grown epitaxially on a GaAs substrate is large and can be as much as 100 nm for a nitrogen content of the order of a few percent. Such a thickness is entirely suitable for making HEMTs or HBTs.

Since the lattice parameter of GaAsN is smaller than that of GaAs, it is possible to add a chemical element to this ternary compound for the purpose of increasing its lattice parameter. Thus, M. Kondow et al. (Jpn. J. Appl. Phys., Vol. 35 (1996), 1273) propose adding indium to form a quaternary compound GaInAsN. According to those authors, the quaternary compound presents a large conduction band discontinuity $\Delta Ec$ relative to GaAs which indicates that it would be advantageous for use in making lasers having high temperature stability.

More precisely, the invention provides a heterojunction transistor comprising III–V semiconductor materials with a material having a broad forbidden band and a material having a narrow forbidden band, the transistor being characterized in that: the narrow forbidden band material is an III–V compound containing gallium as one of its III elements and both arsenic and nitrogen as V elements, the nitrogen content being less than about 5%; and the narrow forbidden band material has at least a fourth III or V element; in such a manner that adding this fourth element makes it possible to adjust the width of the forbidden band, the conduction band discontinuity $\Delta Ec$, and the valance band discontinuity $\Delta Ev$ of the heterojunction.

The large $\Delta Ec$ value of the GaInAsN compound can advantageously be used for making HEMTs.

Under such circumstances, according to various advantageous subsidiary characteristics:

the fourth element is indium, substituted for gallium by a fraction of not more than about 10% so as to provide a forbidden band of about 0.8 eV, a conduction band discontinuity of about 500 meV, and a conduction band discontinuity of about 100 meV;

the broad forbidden band material is AlGaAs with a molar fraction of aluminum of about 25%, so as to obtain a $\Delta Ec$ discontinuity of about 800 meV and a $\Delta Ev$ discontinuity of about 300 meV, i.e. GaInP having an indium molar fraction of about 50%, so as to provide a $\Delta Ec$ discontinuity of about 500 meV and a $\Delta Ev$ discontinuity of about 500 meV;

the fourth element is indium at a molar fraction of about 40%, thus obtaining a narrow forbidden band material with a lattice that is strongly mismatched relative to the GaAs substrate, this narrow forbidden band material is grown epitaxially on the GaAs substrate without dislocations, and the broad forbidden band material is AlInAs with about 40% indium, so as to obtain a ΔEc discontinuity reaching about 1 eV; and the transistor is a field effect transistor of the pseudomorphic HEMT type, in that the narrow forbidden band material GaInAsN possesses indium and nitrogen contents such that its lattice parameter is greater than that of the GaAs substrate and so that it is in an elastically stressed state; and the broad forbidden band material is AlGaAs, so as to obtain ΔEc and ΔEv discontinuities of about 900 meV.

The invention also applies to making heterojunction bipolar transistors in which the narrow forbidden band material forms the base of the transistor and the broad forbidden band material forms the emitter of the transistor.

The fourth embodiment can then be indium, substituted for gallium, at a fraction of no more than about 10% so as to obtain a forbidden band of about 0.8 eV to 1 eV, and the broad forbidden band material being GaInP with an indium content of about 50% so as to obtain a ΔEv discontinuity of about 450 meV.

The material forming the base of the transistor preferably presents a nitrogen content that is either graded, nitrogen content being zero at the interface of the emitter-base heterojunction and increasing towards the base, or else varies stepwise, with the nitrogen content being zero at the emitter-base interface.

Nevertheless, the low value of the valance band discontinuity ΔEv of the GaInAsN material compared with GaAs can constitute a handicap when making HBTs. The present invention thus proposes using antimony as the fourth element, substituting the arsenic by a fraction of not more than about 10%, so as to obtain a forbidden band of about 0.8 eV to 1 eV.

In this case, the broad forbidden band material can be GaAs so as to obtain a ΔEc discontinuity of about 50 meV and a ΔEv discontinuity of about 400 meV, or else it can be GaInP with an indium content of about 50%, so as to obtain a ΔEc, discontinuity of about 100 meV and a ΔEv discontinuity of about 800 meV.

The narrow forbidden band material can be a quinary GaInSbAsN compound.

An implementation of the invention is described below with reference to the accompanying drawings.

FIG. 1 is a band diagram (conduction band and valance band of the GaAs/GaAsN heterojunction.

FIG. 2 is a band diagram of the GaAs/GaInAsN heterojunction.

FIG. 3 is a band diagram of the GaInP/GaAsN heterojunction.

FIG. 4 is a band diagram of the GaInP/GaInAsN heterojunction.

FIG. 5 is a band diagram of the GaInP/GaInAsN heterojunction a configuration in which the GaInP constitutes the emitter of an HBT and the GaInAsN constitutes its base.

FIG. 6 shows how nitrogen content varies in the GaInAsN base.

FIG. 7 shows the band diagram corresponding to the heterojunction described in FIG. 6.

FIG. 8 shows the positions of the conduction and valance bands for the compounds GaAs, GaSb, and InAs, and for the ternary alloys GaSbAs and GaInAs.

FIG. 9 is a band diagram of the GaAs/GaSbAsN heterojunction.

FIG. 10 a band diagram of the GaInP/GaSbsN heterojunction.

FIG. 1 is a band diagram of a GaAs/GaAsN heterojunction.

As shown by M. Kondow et al. (Jpn. J. Appl. Phys., Vol. 35 (1996), 1273) the width of the forbidden band of GaAsN compared with GaAs is reduced mainly by lowering the conduction band. At the GaAs/GaAsN heterojunction interface, this phenomenon gives rise to a large conduction band discontinuity ΔEc and a small valance band discontinuity.

As shown in FIG. 1, the valance band of GaAsN lies below that of GaAs. Given that GaAsN grown epitaxially on GaAs has a lattice parameter mismatch relative thereto and given that this mismatch increases with increasing nitrogen content, it is necessary to limit nitrogen content to about 5% in order to ensure that dislocations do not appear. By limiting nitrogen percentage in GaAs in this way, the width of the forbidden band of GaAsN is about 1 eV, and consequently the conduction band discontinuity ΔEc of the GaAs/GaAsN heterojunction is of the order of about 100 meV, at most.

As a result the GaAs/GaAsN heterojunction is not suitable for making HEMTs. Furthermore, the valance band of GaAsN lies below that of GaAs, so the GaAs/GaAsN heterojunction is not suitable for making high performance HBTs either.

To make a high performance HEMT, it is necessary to find a way of increasing the ΔEc discontinuity. This constitutes the subject matter of the present invention and consists in using the GaInAsN alloy as the narrow forbidden band material. M. Kondow et al. (cited above) have shown that adding low percentages of indium in GaAsN have the effect of reducing the width of the forbidden band of GaAsN, in the same manner as adding indium to GaAs reduces the width of the forbidden band of GaInAs. This reduction in the forbidden bandwidth of GaInAsN occurs more with the conduction band than with the valance band.

This gives a value of about 500 meV for the ΔEc discontinuity, which is equivalent to that of a pseudomorphic HEMT made with the AlGaAs/GaInAs heterojunction that is well known to the person skilled in the art.

The ΔEc discontinuity can be further increased if the AlGaAs/GaInAsN heterojunction is used, since the AlGaAs/GaAs heterojunction also presents a ΔEc discontinuity which adds to that of the GaAs/GaInAsN. It is known that this characteristic of ΔEc transitivity applies to III–V compounds, and as a result it is possible to obtain discontinuities in excess of 800 meV for the AlGaAs/GaInAsN heterojunction, which value is difficult to achieve in heterojunctions without nitrogen. In heterojunctions made up of materials based on arsenide, the greatest ΔEc discontinuity is obtained for the AlInAs/GaInAs heterojunction in which the indium content is about 40%. Unfortunately, compounds rich in indium have crystal lattice parameters that are 3% greater than those of GaAs, so it is difficult to grow them epitaxially on a GaAs substrate without giving rise to dislocations. Nevertheless, the person skilled in the art can restrict the propagation of dislocations within a buffer layer, thus leaving active layers that are free from any dislocations (see for example WO-A-99/14809 (Picogiga) or S. Bolaert et al. IEEE Electron Dev. Lett., 20, 123 (1999)). These methods enable metamorphic HEMTs to be made that can also be used for growing GaInAsN materials having high indium content of about 30% to 40%. The ΔEc discontinuity of AlInAs/GaInAsN heterojunctions with 30% to 40% indium then exceeds 1 eV.

Another way of proceeding, and constituting the subject matter of the present invention, is to make AlGaAs/GaInAsN heterojunctions in which the indium content is selected in such a manner that the GaInAsN epitaxial layer has a lattice mismatch relative to the GaAs substrate. An HEMT using such a heterojunction is then a pseudomorphic HEMT so the ΔEc discontinuity exceeds 900 meV.

In the description above, the invention relates to HEMTs.

Concerning HBTs, the person skilled in the art knows that the heterojunction constituting the emitter and the base of the HBT must present the following characteristics:

the forbidden band of the base must be narrower than that of the emitter;

the valance band discontinuity must be broad;

the valance band of the base must lie above that of the emitter; and the conduction band discontinuity must be small so as to avoid pointlessly increasing the ON voltage $V_{BE}$ of the transistor.

As mentioned above and as can be seen in FIG. 1, the GaAs/GaAsN heterojunction does not satisfy these conditions.

However, the GaInP/GaAsN heterojunction does satisfy them, providing the ΔEv discontinuity is large (FIG. 3). The GaInP/GaAs heterojunction presents a ΔEv discontinuity of about 400 meV, and the GaAs/GaAsN heterojunction presents a ΔEv discontinuity of about −20 meV for an indium content of 5%. The transitivity of valance band discontinuity gives a ΔEv discontinuity of about 380 meV for GaInP/GaAsN, which is sufficient to make a high performance HBT. On the conduction band side, the ΔEc discontinuity between GaAs and GaAsN is about 50 meV and the discontinuity of GaInP and GaAs is 70 meV, giving the GaInP/GaAsN heterojunction a total value of 120 meV, which is entirely suitable for making a high performance HBT. Nevertheless, GaAsN with 5% indium content has a forbidden bandwidth close to that of GaAs, i.e. about 1.35 eV. For applications in which it is necessary to lower the ON voltage $V_{BE}$ significantly, it is advantageous to further reduce the width of the forbidden band of the narrow forbidden band material, and the GaInAsN material whose properties are described above is entirely suitable.

FIG. 4 is a band diagram for the GaInP/GaInAsN heterojunction. The transitivity of the band discontinuities between GaAs/GaInAsN and GaInP/GaAs gives the GaInP/GaInAsN heterojunction a ΔEv discontinuity of about 450 meV and a ΔEc discontinuity of about 550 meV when the indium and nitrogen contents are a few percent each, thus giving a forbidden bandwidth that is less than or equal to 1 eV.

In this configuration, the large value for ΔEc is, in contrast, unfavorable: firstly because electrons coming from the GaInP emitter and going to the GaInAsN base have energy that is too high and run the risk of being injected into the L band of the material where the effective mass of an electron is large; and secondly because a large value for ΔEc creates an energy peak at the (n type) GaInP/(p type) GaInAsN interface, thereby creating an energy barrier which needs to be crossed by electrons injected from the emitter towards the base (FIG. 5). This situation increases the ON voltage $V_{BE}$ of the transistor.

To reduce the ΔEc discontinuity at the GaInP/GaInAsN heterojunction interface, it is possible to make a base with graded composition in which the nitrogen content is low or even zero at the interface and increases gradually on going away from the interface, as shown in FIG. 6.

FIG. 7 shows the corresponding band diagram (the same effect can be obtained by causing the composition to vary stepwise). When only the nitrogen composition is caused to vary without changing the indium composition, the emitter-base junction is a GaInP/GaInAs heterojunction where the conduction band discontinuity ΔEc is about 100 meV for an indium content of 10%, and is entirely suitable for a high performance HBT. For an indium content of 10%, the forbidden bandwidth is about 1.3 eV. The forbidden bandwidth of GaInAs can be further reduced by using an indium content exceeding 25% so as to reach a forbidden bandwidth of 1 eV and a ΔEc discontinuity of about 200 meV. Under such conditions, the GaInAs layer is highly stressed as it is in pseudomorphic HEMTs. The thickness of the GaInAs layer is then about 10 nm to 12 nm.

Advantageously, the ΔEc discontinuity can be reduced and the ΔEv discontinuity can be increased by using a material containing antimony for the base, such as GaSbAs or GaSbAsN. It is known that the valance band of the compound GaSb is situated precisely at the energy level of the conduction band of InAs (see for example L. Esaki, The technology and physics of molecular beam epitaxy, Plenum Press, 1985, p. 171, or S. Sakai (cited above)).

By using a rule of thumb which works well for III–V semiconductors, whereby the valance band is aligned to the detriment of conduction band curvature, a configuration is obtained as shown in FIG. 8.

This figure is a diagram showing the positions of the valance and conduction bands for the three materials GaAs, GaSb, and InAs, and also for the ternary alloys GaInAs and GaSbAs. It can be seen that the GaSbAs alloys have their valance band situated above that of the GaInAs alloys. The same applies to their conduction bands. It can be deduced from FIG. 8 that the GaAs/GaSbAs heterojunction presents a ΔEc that is smaller and a ΔEv that is larger than those of the GaAs/GaInAs heterojunction. It is therefore more advantageous to use the GaAs/GaSbAs heterojunction for making HBTs.

However, GaSbAs presents a lattice parameter difference relative to GaAs, and it is therefore not possible to have an indium content that is large enough and/or a thickness that is large enough to be able to make a transistor base. Substituting a low concentration of nitrogen to form the quaternary GaSbAsN makes it possible to readjust the lattice parameter as with GaInAsN, and as with GaInAsN a low nitrogen content in this quaternary alloy makes it possible simultaneously to reduce the width of the forbidden band to values close to 0.8 eV, which encourages reducing the voltage $V_{BE}$.

Since the addition of nitrogen shifts the ΔEc discontinuity towards high values, the band diagram for the GaAs/GaSbAsN heterojunction has the appearance shown in FIG. 9. The band discontinuities of this heterojunction are not well known, but it can be estimated that for a nitrogen content of 2% to 3% and an antimony content of about 10%, ΔEc is about 50 meV and ΔEv is about 350 meV to 400 meV. These values are highly comparable to those of the GaInP/GaAs heterojunction which is known to be very well suited to making high performance HBTs.

By band transitivity, the GaInP/GaSbAsN association gives a ΔEc discontinuity of 100 meV and a ΔEv discontinuity of 800 meV, approximately (FIG. 10).

In the description above, it is mentioned that adding indium to GaAsN has the effect of creating a large conduction band discontinuity ΔEc, whereas adding antimony creates a small ΔEc discontinuity. The opposite effect applies to the valance band discontinuity ΔEv. It is therefore possible to adjust the ΔEc and ΔEv discontinuities by using quinary compounds GaInSbAsN.

What is claimed is:

1. A heterojunction transistor comprising:
   a III–V semiconductor material having a broad forbidden band comprised of III–V compound containing gallium as one of its III elements and both arsenic and nitrogen as V elements, the nitrogen content being less than about 5%; and
   a III–V semiconductor material having a narrow forbidden band comprised of at least a fourth III or V element wherein said fourth element permits adjustment of the width of the forbidden band, the conduction band discontinuity $\Delta Ec$, and the valance band discontinuity $\Delta Ev$ of the heterojunction.

2. The transistor of claim 1, characterized in that the transistor is a field effect transistor of the HEMT type.

3. The transistor of claim 2, characterized in that the fourth element is indium, substituted for gallium by a fraction of not more than about 10% so as to provide a forbidden band of about 0.8 eV, a conduction band discontinuity of about 500 meV, and a conduction band discontinuity of about 100 meV.

4. The transistor of claim 2, characterized in that the broad forbidden band material is AlGaAs with a molar fraction of aluminum of about 25%, so as to obtain a $\Delta Ec$ discontinuity of about 800 meV and a $\Delta Ev$ discontinuity of about 300 meV.

5. The transistor of claim 2, characterized in that the broad forbidden band material is GaInP having a molar fraction of indium of about 50%, so as to obtain a $\Delta Ec$ discontinuity of about 500 meV and a $\Delta Ev$ discontinuity of about 500 meV.

6. The transistor of claim 2, characterized in that the fourth element is indium at a molar fraction of about 40%, thus obtaining a narrow forbidden band material with a lattice that is strongly mismatched relative to the GaAs substrate, in that this narrow forbidden band material is grown epitaxially on the GaAs substrate without dislocations, and in that the broad forbidden band material is AlInAs with about 40% indium, so as to obtain a $\Box Ec$ discontinuity reaching about 1 eV.

7. The transistor of claim 6, characterized in that the transistor is a field effect transistor of the pseudomorphic HEMT type, in that the narrow forbidden band material GaInAsN possesses indium and nitrogen contents such that its lattice parameter is greater than that of the GaAs substrate and so that it is in an elastically stressed state; and in that the broad forbidden band material is AlGaAs, so as to obtain $\Delta Ec$ and $\Delta Ev$ discontinuities of about 900 meV.

8. The transistor of claim 1, wherein the transistor is a heterojunction bipolar transistor and in that the narrow forbidden band material forms the base of the transistor and the broad forbidden band material forms the emitter of the transistor.

9. The transistor of claim 8, wherein the fourth element is indium, substituted for gallium, at a fraction of no more than about 10% so as to obtain a forbidden band of about 0.8 eV to 1 eV, and in that the broad forbidden band material is GaInP with an indium content of about 50% so as to obtain a $\Delta Ev$ discontinuity of about 450 meV.

10. The transistor of claim 9, wherein the material forming the base of the transistor has graded nitrogen content, the nitrogen content being zero at the emitter-base heterojunction interface and increasing going towards the base.

11. The transistor of claim 9, characterized in that the material forming the base of the transistor has nitrogen content increasing stepwise, the nitrogen content being zero at the emitter-base interface.

12. The transistor of claim 8, characterized in that the fourth embodiment is antimony, substituting the arsenic with a fraction of no more than about 10%, so as to provide a forbidden band of about 0.8 eV to 1 eV.

13. The transistor of claim 12, characterized in that the broad forbidden band material is GaAs so as to obtain a $\Delta Ec$ discontinuity of about 50 meV and a $\Delta Ev$ discontinuity of about 400 meV.

14. The transistor of claim 12, characterized in that the broad forbidden band material is GaInP with an indium content of about 50%, so as to obtain a $\Delta Ec$ discontinuity of about 100 meV and a $\Delta Ev$ discontinuity of abut 800 meV.

15. The transistor of claim 8, characterized in that the narrow forbidden band material is a quinary compound GaInSbAsN.

16. A bipolar heterojunction transistor comprising:
    a III–V semiconductor material having a broad forbidden band comprised of a III–V compound containing gallium as one of its III elements and both arsenic and nitrogen as V elements, the nitrogen content being less than about 5%, and the broad forbidden band material forms the emitter of the transistor; and
    a III–V semiconductor material having a narrow forbidden band comprised of at least a fourth III or V element, wherein said fourth element permits adjustment of the width of the forbidden band, the conduction band discontinuity $\Delta Ec$, and the valance band discontinuity $\Delta Ev$ of the heterojunction, wherein the narrow forbidden band material forms the base of the transistor and wherein the fourth element is indium, substituted for gallium, at a fraction of no more than about 10% so as to obtain a forbidden band of about 0.8 eV to 1 eV, and in that the broad forbidden band material is GaInP with an indium content of about 50% so as to obtain a $\Delta Ev$ discontinuity of about 450 meV.

* * * * *

UNITED STATES PATENT AND TRADEMARK OFFICE
CERTIFICATE OF CORRECTION

PATENT NO. : 6,787,822 B1
APPLICATION NO. : 09/979098
DATED : September 7, 2004
INVENTOR(S) : Nuyen It is certified that error appears in the above-identified patent and that said Letters Patent is hereby corrected as shown below:

Col. 9, claim 1 should read as follows:

1. A heterojunction transistor comprising III-V semiconductor materials having a broad forbidden band material and a narrow forbidden band material, said narrow forbidden band material comprised of a III-V compound containing gallium as one of its III elements and both arsenic and nitrogen as V elements, the nitrogen content being less than about 5%, wherein said narrow forbidden band material is comprised of at least a fourth III or V element, wherein said fourth element permits adjustment of the width of the forbidden band, the conduction band discontinuity $\Delta Ec$, and the valance band discontinuity $\Delta Ev$ of the heterojunction.

Col. 10, claim 16 should read as follows:

16. A bipolar heterojunction transistor comprising III-V semiconductor materials having a broad forbidden band material and a narrow forbidden band material, said narrow forbidden band material comprised of a III-V compound containing gallium as one of its III elements and both arsenic and nitrogen as V elements, the nitrogen content being less than about 5%, and the broad forbidden band material forms the emitter of the transistor, wherein said narrow forbidden band material is comprised of at least a fourth III or V element, wherein said fourth element permits adjustment of the width of the forbidden band, the conduction band discontinuity $\Delta Ec$, and the valance band discontinuity $\Delta Ev$ of the heterojunction, wherein the narrow forbidden band material forms the base of the transistor and wherein the fourth element is indium, substituted for gallium, at a fraction of no more than about 10% so as to obtain a forbidden band of about 0.8 eV to 1 eV, and in that the broad forbidden band material is GaInP with an indium content of about 50% so as to obtain a $\Delta Ev$ discontinuity of about 450 meV.

Signed and Sealed this

Seventeenth Day of April, 2007

JON W. DUDAS
*Director of the United States Patent and Trademark Office*